(12) United States Patent
Song et al.

(10) Patent No.: US 8,014,539 B2
(45) Date of Patent: Sep. 6, 2011

(54) METHOD AND APPARATUS TO CONTROL OUTPUT POWER OF A DIGITAL POWER AMPLIFIER OPTIMIZED TO A HEADPHONE AND A PORTABLE AUDIO PLAYER HAVING THE SAME

(75) Inventors: Young-suk Song, Suwon-si (KR); Zhun-woo Kim, Seoul (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 1359 days.

(21) Appl. No.: 11/581,338

(22) Filed: Oct. 17, 2006

(65) Prior Publication Data

US 2007/0098190 A1    May 3, 2007

(30) Foreign Application Priority Data

Nov. 3, 2005    (KR) .................. 10-2005-0105066

(51) Int. Cl.
*H04R 1/10* (2006.01)

(52) U.S. Cl. .................................................. 381/74

(58) Field of Classification Search .............. 381/58, 381/59, 74, 384, 309, 55, 77, 107, 120; 330/192, 330/278, 279, 282, 297, 251, 10; 439/668
See application file for complete search history.

(56) References Cited

U.S. PATENT DOCUMENTS

| 5,532,649 | A  | * | 7/1996 | Sahyoun ................. 330/297 |
| 6,744,310 | B2 | * | 6/2004 | Honda ..................... 330/2 |

FOREIGN PATENT DOCUMENTS

| JP | 2001-202696 | 7/2001 |
| JP | 2004-328320 | 11/2004 |
| KR | 97-11002 | 3/1997 |
| KR | 2002-89884 | 11/2002 |

* cited by examiner

*Primary Examiner* — Vivian Chin
*Assistant Examiner* — Kile Blair
(74) *Attorney, Agent, or Firm* — Stanzione & Kim, LLP

(57) ABSTRACT

A method and apparatus to control output power of a digital amplifier capable of automatically determining an impedance of an earphone or headphone connected to a portable audio device and outputting a power that is optimized according to the impedance. The apparatus is usable with a digital amplification device and includes a signal processing unit to convert a pulse signal into a direct current (DC) voltage by power-amplifying the pulse signal, an impedance measuring unit to connect a resistance device between the signal processing unit and a speaker unit and to detect a voltage value applied to the resistance device and the speaker unit, and a micom unit to generate a pulse signal having a predetermined duty cycle in the signal processing unit if the speaker unit is connected to the device, to determine an impedance of the speaker unit based on the voltage value detected by the impedance measuring unit, to control a power amplification by providing a voltage level control signal to the signal processing unit according to the determined impedance, and to control an audio level in an audio reproduction mode accordingly.

17 Claims, 7 Drawing Sheets

FIG. 2A (PRIOR ART)

| WHEN $V_{O\_RMS}$ = 0.310 Vrms | | |
|---|---|---|
| HEADPHONE IMPEDANCE | POWER CONSUMED IN HEADPHONE | AUDIBLE SOUND PRESSURE INFORMATION |
| 16 Ω | 6.01 mW | NORMAL |
| 32 Ω | 3.00 mW | SMALL |
| 60 Ω | 1.60 mW | VERY SMALL |
| 100 Ω | 0.96 mW | DIFFICULT TO HEAR |
| 120 Ω | 0.80 mW | DIFFICULT TO HEAR |

FIG. 2B (PRIOR ART)

| WHEN $V_{O\_RMS}$ = 0.846 Vrms | | |
|---|---|---|
| HEADPHONE IMPEDANCE | POWER CONSUMED IN HEADPHONE | AUDIBLE SOUND PRESSURE INFORMATION |
| 16 Ω | 44.7 mW | POSSIBLE TO HURT EARS |
| 32 Ω | 22.4 mW | VERY BIG |
| 60 Ω | 11.9 mW | BIG |
| 100 Ω | 7.2 mW | A LITTLE BIG |
| 120 Ω | 6.0 mW | NORMAL |

US 8,014,539 B2

METHOD AND APPARATUS TO CONTROL OUTPUT POWER OF A DIGITAL POWER AMPLIFIER OPTIMIZED TO A HEADPHONE AND A PORTABLE AUDIO PLAYER HAVING THE SAME

CROSS-REFERENCE TO RELATED APPLICATIONS

This application claims the benefit of Korean Patent Application No. 10-2005-0105066, filed on Nov. 3, 2005, in the Korean Intellectual Property Office, the disclosure of which is incorporated herein in its entirety by reference.

BACKGROUND OF THE INVENTION

1. Field of the Invention

The present general inventive concept relates to a portable audio reproduction apparatus, and more particularly, to a method and apparatus to control an output power of a digital amplifier capable of automatically determining an impedance of an earphone or headphone connected to a portable audio device and enabling a power output to be optimized for the earphone or headphone.

2. Description of the Related Art

Recently, users of portable audio devices, such as MP3 players and portable multimedia players (PMPs), have demanded high quality sound. Also, the portable audio devices use digital audio amplifiers for low power consumption, smaller size, and high quality sound. Generally, A class, B class, AB class, and D class are used for digital audio amplifiers. Among these digital amplifiers, D class amplifier can reduce degradation of amplification efficiency occurring in the A, B, and AB class amplifiers. The D class amplifier converts an audio signal into a pulse width modulation (PWM) signal and switches the signal. In addition, a variety of earphones and headphones ranging from a 16Ω impedance earphone offered as a bundle item to a 120Ω impedance high-end headphone are being used in the portable audio devices.

Accordingly, in order to support the variety of earphones and/or headphones, an output capacity of a portable audio device should be large enough and a magnitude of an output signal should be set differently with respect to a type of the earphone and/or headphone being used in the portable audio device.

FIG. 1 is a block diagram illustrating a conventional digital amplification apparatus.

Referring to FIG. 1, a digital audio signal is output to an earphone/headphone 180 through a PWM unit 130, a power switching unit 150, and a low-pass filter 160.

An analog to digital converter (ADC) unit 120 converts a sound input to a microphone 122 into a digital signal in order to record the sound in a recorder. A microcomputer (micom) unit 110 generates different control signals and an ADC control signal to control respective blocks and units. A power supply unit 140 provides a predetermined direct current (DC) voltage (fixed $V_{DC}$) to the power switching unit 150.

However, there occurs a large difference in magnitude (volume) of sound that a user hears according to a magnitude of an impedance of the earphone/headphone 180 connected to an output end of an amplifier. In general, an output power of an earphone or headphone at the magnitude of volume that a user hears most conveniently ranges from 5 mW to 7 mW.

For example, with reference to a 16Ω impedance headphone, a magnitude of a signal at the output end of the amplifier at which an output power of about 6 mW is obtained is 0.310 Vrms when the output signal is measured in a root square mean (RMS).

Accordingly, since most audio devices employ a 16Ω impedance earphone, an output level of the amplifier is set to 0.310 Vrms in order to output the output power of about 6 mW (approximately volume level 20).

However, since the output level of the amplifier is still set to 0.310 Vrms even when a 120Ω impedance high-end headphone is connected, an actual output power of the headphone may be limited to only about 0.8 mW. Accordingly, even though a user sets an identical volume level, if the impedance of the earphone/headphone 180 is increased, the sound output from the headphone/earphone 180 may become too soft to hear.

Similarly, if the volume level is set to deliver an output of about 6 mW with a 120Ω impedance high-end headphone, and the amplifier connection is then switched to a 16Ω impedance headphone, the user hears a very loud sound of about 44.7 mW and the user's ears may be hurt. FIGS. 2A and 2B are tables comparing headphone impedances, power consumptions in a headphone, and audible sound pressures with respect to magnitudes of signals output by the amplifier.

Therefore, according to the conventional digital amplification apparatus, unless the magnitude of the amplifier is appropriately adjusted with respect to the characteristics of the earphone or headphone impedance connected to the apparatus, the user may either not be able to hear the sound being amplified or may hear the sound at a decibel level that is too loud.

SUMMARY OF THE INVENTION

The present general inventive concept provides a method and apparatus capable of controlling output power of a digital amplifier in an audio device according to a measured impedance of an earphone or headphone connected to the digital amplifier such that an appropriate output level of the digital amplifier is determined.

Additional aspects of the present general inventive concept will be set forth in part in the description which follows and, in part, will be obvious from the description, or may be learned by practice of the general inventive concept.

The foregoing and/or other aspects of the present general inventive concept may be achieved by providing an apparatus to control output power of a digital amplifier in a digital audio amplification device, the apparatus including a signal processing unit to power amplify a pulse signal and to convert the pulse signal into a direct current (DC) voltage, an impedance measuring unit to connect a resistance device between the signal processing unit and a speaker unit and to detect a voltage value applied to the resistance device and the speaker unit, and a micom unit to generate a pulse signal having a predetermined duty cycle in the signal processing unit if the speaker unit is connected to the device, to determine an impedance of the speaker unit based on the voltage value detected by the impedance measuring unit, to control power amplification by providing a voltage level control signal to the signal processing unit according to the determined impedance, and to control an audio level in an audio reproduction mode accordingly.

The foregoing and/or other aspects of the present general inventive concept may also be achieved by providing a digital amplifier usable in a portable audio device, the amplifier including a signal processing unit having a variable power supply unit to output a variety of voltages, the signal processing unit receiving an audio signal and amplifying the audio signal based on a DC voltage currently output by the variable power supply unit, an impedance measuring unit to measure an impedance value of any speaker unit connected to the portable audio device and to output an impedance detection signal, and a micom unit to receive the impedance detection signal and to control the variable power supply unit to update the DC voltage currently output based on the measured impedance value indicated by the impedance detection signal.

The foregoing and/or other aspects of the present general inventive concept may also be achieved by providing a portable audio device, including a digital amplifier to amplify an audio signal based on a power supply level of a power supply, and a power supply control unit to vary the power supply level of the power supply based on an impedance of at least one speaker unit connected to the digital amplifier.

The foregoing and/or other aspects of the present general inventive concept may also be achieved by providing a portable audio device, including an output port, an audio unit to output an audio signal, and an amplifier to receive the audio signal from the audio unit and to amplify the audio signal based on an impedance value detected at the output port.

The foregoing and/or other aspects of the present general inventive concept may also be achieved by providing a portable audio device, including a digital amplifier to amplify an audio signal based on a power supply level of a power supply, and an apparatus to control an output power of the digital amplifier by varying the power supply level of the power supply based on an impedance of at least one speaker unit connected to the digital amplifier. The apparatus includes a signal processing unit to power amplify a pulse signal and to convert the pulse signal into a direct current (DC) voltage, an impedance measuring unit to connect a resistance device between the signal processing unit and the at least one speaker unit and to detect a voltage value applied to the resistance device and the at least one speaker unit, and a micom unit to generate a pulse signal having a predetermined duty cycle in the signal processing unit if the at least one speaker unit is connected to the portable audio device, to determine the impedance of the at least one speaker unit based on the voltage value detected by the impedance measuring unit, to control a power amplification by providing a voltage level control signal to the signal processing unit according to the determined impedance, and to control an audio level in an audio reproduction mode accordingly.

The foregoing and/or other aspects of the present general inventive concept may also be achieved by providing a portable audio device, including a signal processing unit having another terminal to generate a voltage signal in a headphone impedance measuring mode, a terminal to be connected to an external headphone, an impedance measuring unit to be selectively connected between the terminal and the another terminal to generate one of a first value and a second value according to the voltage signal corresponding to a characteristic of the external headphone, and a processor unit to control the signal processing unit to generate one of a first audio reproducing signal and a second audio reproducing signal according to the one of the first value and the second value.

The foregoing and/or other aspects of the present general inventive concept may also be achieved by providing a method of controlling output power of a digital audio amplification device, the method including if a speaker unit is connected to the digital audio amplification device, setting an impedance measuring mode and generating an arbitrary pulse signal, converting the arbitrary pulse signal into a DC voltage, applying the DC voltage to a resistance device connected to the speaker unit and detecting a voltage between the resistance device and the speaker unit, determining an impedance of the connected speaker unit based on the detected voltage, and adjusting a level of audio being reproduced by controlling switching power-amplification with respect to the determined impedance of the speaker unit.

BRIEF DESCRIPTION OF THE DRAWINGS

These and/or other aspects of the present general inventive concept will become apparent and more readily appreciated from the following description of the embodiments, taken in conjunction with the accompanying drawings of which:

FIGS. 2A and 2B are tables comparing headphone impedances, power consumptions in a headphone, and audible sound pressures with respect to magnitudes of signals;

DETAILED DESCRIPTION OF THE PREFERRED EMBODIMENTS

Figure 1:
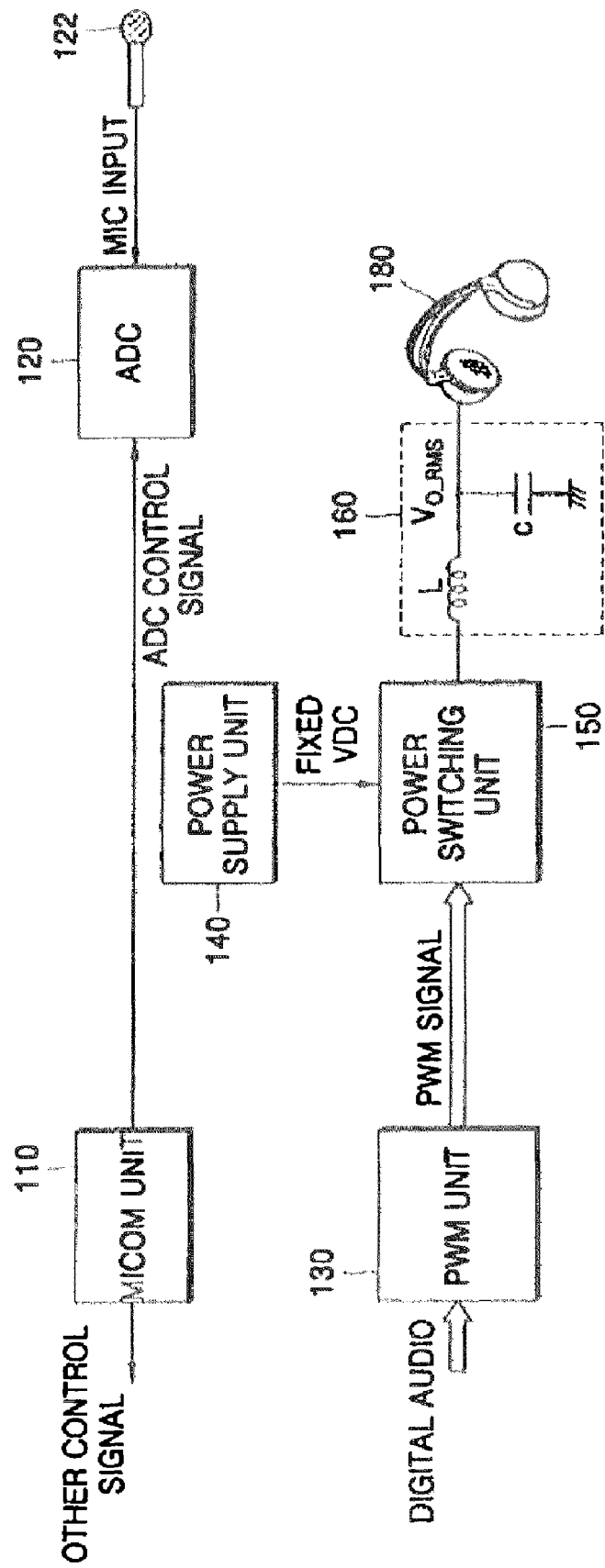
FIG. 1 is a block diagram illustrating a conventional digital amplification apparatus.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 3:
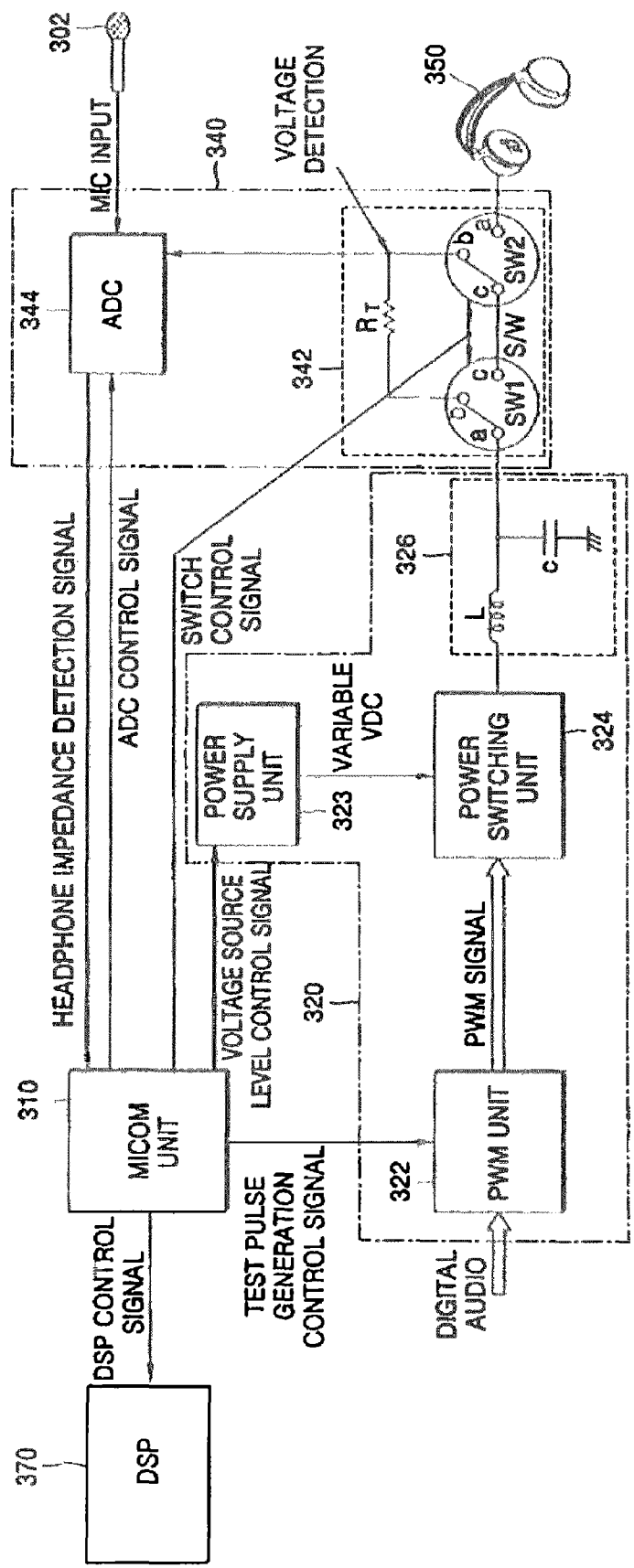
FIG. 3 is a block diagram illustrating an apparatus to control an output power of a digital amplifier according to an embodiment of the present general inventive concept.

FIG. 3 is a block diagram illustrating an apparatus to control an output power of a digital amplifier according to an embodiment of the present general inventive concept.

The output power controlling apparatus of FIG. 3 includes a microcomputer (micom) unit 310, a signal processing unit 320, an impedance measuring unit 340, and a headphone 350. Here, the headphone 350 may be replaced by a variety of speaker units including different types of headphones, earphones, and speakers. The output power controlling apparatus of FIG. 3 may be included in an audio device or a portable audio player.

The signal processing unit 320 includes a pulse width modulation (PWM) unit 322, a power supply unit 323, a power switching unit 324, and a low-pass filter 326. The impedance measuring unit 340 includes a voltage measuring unit 342 including a first switch (SW1), a second switch (SW2), and a test resistor ($R_T$), and an analog to digital converter (ADC) unit 344.

The signal processing unit 320 may be the digital amplifier and power-amplifies an arbitrary pulse signal having a predetermined duty cycle into a DC voltage when operating in a headphone impedance measuring mode. When operating in an audio reproduction mode, the signal processing unit 320 extracts an audio signal from a PWM signal generated from a digital audio signal by comparing the audio signal and a carrier signal.

The impedance measuring unit 340 connects the test resistor ($R_T$) between the signal processing unit 320 and the headphone 350 in the headphone impedance measuring mode, and detects a voltage value applied between the test resistor ($R_T$) and the headphone 350.

The micom unit 310 switches between the headphone impedance measuring mode and the audio reproduction mode according to whether the headphone 350 is connected to the output power controlling apparatus and the digital amplifier (i.e., a digital amplification device). In particular, in the headphone impedance measuring mode, the micom unit 310 controls the signal processing unit 320 to generate the arbitrary pulse signal with the predetermined duty cycle, determines an impedance of the headphone 350 based on the voltage value detected at the test resistor ($R_T$) by controlling an impedance measuring switch of the impedance measuring unit 340, and generates a voltage level control signal to control a switching power level of the signal processing unit 320 according to the determined impedance of the headphone 350. A method of sensing a connection between the headphone 350 and the impedance measuring unit 340 used by the micom unit 310 may be performed using a known technology, for example, by using changes in a voltage level of an output end of the headphone 350. Other methods including mechanical contact may also be used to sense the connection between the headphone 350 and the impedance measuring unit 340.

Referring to FIG. 3, the operation of the apparatus to control the output power of a digital amplifier according to an embodiment of the present general inventive concept will now be explained in more detail.

The micom unit 310 outputs an ADC control signal and a switch control signal to the ADC unit 344 and the first and second switches (SW1, SW2), respectively, according to whether the output power controlling apparatus is in the headphone impedance measuring mode or the audio reproduction mode. First, if the connection of the headphone 350 is sensed, the micom unit 310 sets the ADC unit 344 and the first and second switches (SW1, SW2) to the impedance measuring mode using the ADC control signal and the switch control signal. That is, in the impedance measuring mode, according to the switch control signal, the first and second switches (SW1, SW2) connect an output end (terminal) (a) of the low-pass filter unit 326 and an input end (terminal) (a) of the headphone 350 to both ends (terminals) (b) of the test resistor (RT). In the audio reproducing mode, the ADC unit 344 inputs a microphone signal of the microphone 302. If the operation mode is changed from the audio reproducing mode to the headphone impedance measuring mode, the ADC unit 344 converts a voltage value detected at a test point into a digital signal. The test point may be disposed between the test resistor (RT) and the second switch (SW2).

At the same time, the micom unit 310 outputs a test pulse generation control signal to the PWM unit 322. If the test pulse generation control signal and a mode control signal from the micom unit 310 are received by the PWM unit 322, the PWM unit 322 outputs the pulse signal with the predetermined duty cycle to the power switching unit 324 for a predetermined time. Then, the power switching unit 324 performs power switching with the pulse signal with the predetermined duty cycle (or duty ratio) output from the PWM unit 322 with respect to the voltage supplied by the power supply unit 323. The low-pass filter unit 326 includes a coil (L) and a capacitor (C) and converts the pulse signal with the predetermined duty ratio into a DC voltage. Then, the DC voltage output from the low-pass filter unit 326 is applied to the test resistor ($R_T$) connected to the headphone 350. Accordingly, the ADC unit 344 converts the voltage value detected between the test resistor ($R_T$) and the headphone 350 (i.e., at the test point) into a voltage value in a digital form. The digital voltage value is a headphone impedance detection signal, and the ADC unit 344 outputs the headphone impedance detection signal to the micom unit 310. The micom unit 310 extracts the voltage value from the headphone impedance detection signal, and determines the impedance of the headphone 350 from the voltage value according to a preset table. The preset table may be stored in a memory (not illustrated) and may include a plurality of impedances corresponding to a plurality of voltage values. For example, if the voltage value is in a range of 0.04~0.05V, the micom unit 310 determines that the impedance of the headphone 350 is 32Ω. If the voltage value is in a range of 0.02~0.03V, the micom unit 310 determines that the impedance is 16Ω.

Then, the micom unit 310 generates a voltage level control signal to control a magnitude of a DC voltage of the power supply unit 323 based on the impedance of the headphone 350 as determined by the impedance measuring unit 340. Accordingly, the power supply unit 323 outputs a variable DC voltage according to the voltage level control signal generated by the micom unit 310. For example, if the detected impedance is small, the micom unit 310 outputs the voltage level control signal to control the power supply unit 323 to output the DC voltage to have a small magnitude. Similarly, if the detected impedance is large, the micom unit 310 outputs the voltage level control signal to control the power supply unit 323 to output the DC voltage to have a large magnitude. Then, once the magnitude of the DC voltage is adjusted, the micom unit 310 outputs a control signal to each component of the output power controlling apparatus (e.g., the PWM unit 322, the power supply unit 323, the first and second switches (SW, SW2), and the ADC unit 344) to switch from the headphone impedance measuring mode to the audio reproduction mode. That is, in the audio reproducing mode, the first and second switches (SW1, SW2) connect the output end (a) of the low-pass filter unit 326 with the input end (a) of the headphone 350 according to the switch control signal of the micom unit 310. The PWM unit 322 compares the audio signal and the carrier signal and generates a PWM signal. The power switching unit 324 amplifies the voltage and current of the PWM signal output from the PWM unit 322 with respect to the DC voltage supplied by the power supply unit 323. The low-pass filter unit 326 extracts the audio signal to be reproduced by removing a high frequency component of the PWM signal output from the power switching unit 324. Accordingly, by controlling a switching power level of the power switching unit 324, the level of the audio signal input to the headphone 350 is adjusted.

In another embodiment, when it is difficult to adjust the magnitude of the DC voltage of the power supply unit 323, the micom unit 310 outputs a digital signal processor (DSP) control signal to control a level of volume appropriate for the detected impedance of the headphone 350 to a DSP unit 370. Accordingly, the DSP unit 370 adjusts the volume level according to this DSP control signal.

Figure 4:
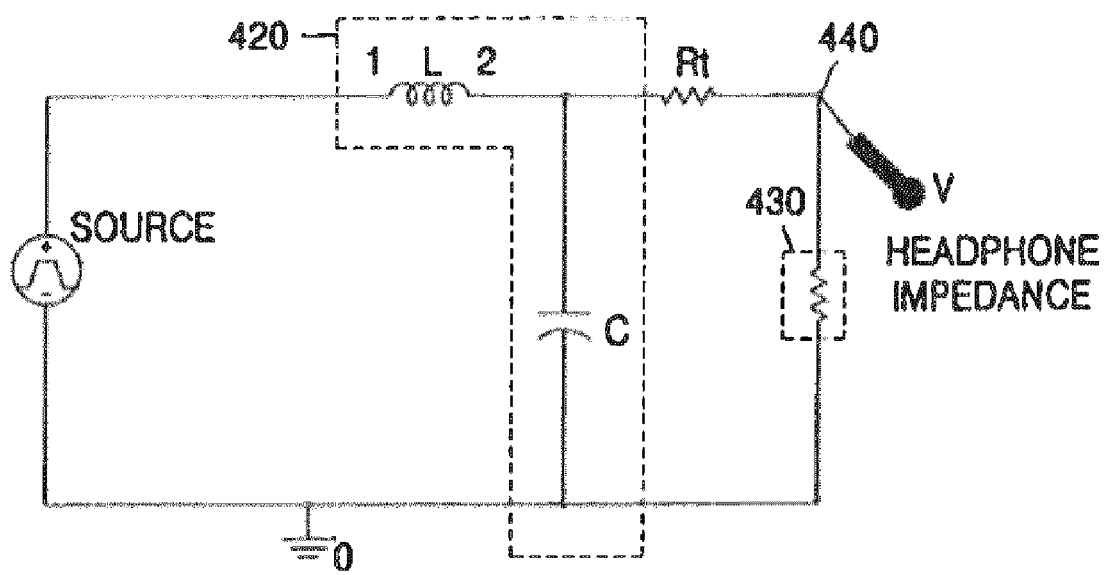
FIG. 4 illustrates a measuring circuit in a headphone impedance measuring mode according to an embodiment of the present general inventive concept.

FIG. 4 illustrates a measuring circuit in a headphone impedance measuring mode according to an embodiment of the present general inventive concept.

Referring to FIG. 4, a source unit ('SOURCE') is modeling an output signal of a digital amplifier and generates a pulse wave with a predetermined duty cycle. An L/C filter unit 420 removes a high frequency component of the pulse wave through inductive L and capacitive C components, passes only a signal in an audio band, and converts the input signal with the predetermined duty cycle into a signal that approximates a DC signal. The DC signal is provided to a test resistor ($R_T$) and the headphone impedance 430. Accordingly, at a voltage detection point 440, an appropriate voltage is detected according to a ratio of resistance values (i.e., the headphone impedance and the test resistor $R_T$). The impedance 430 of the headphone is measured by this detected voltage value. Here, since almost only a DC component remains in the voltage passing through the L/C filter unit 420, the headphone impedance 430 component can be modeled using a circuit diagram with only a resistance component.

Figure 5:
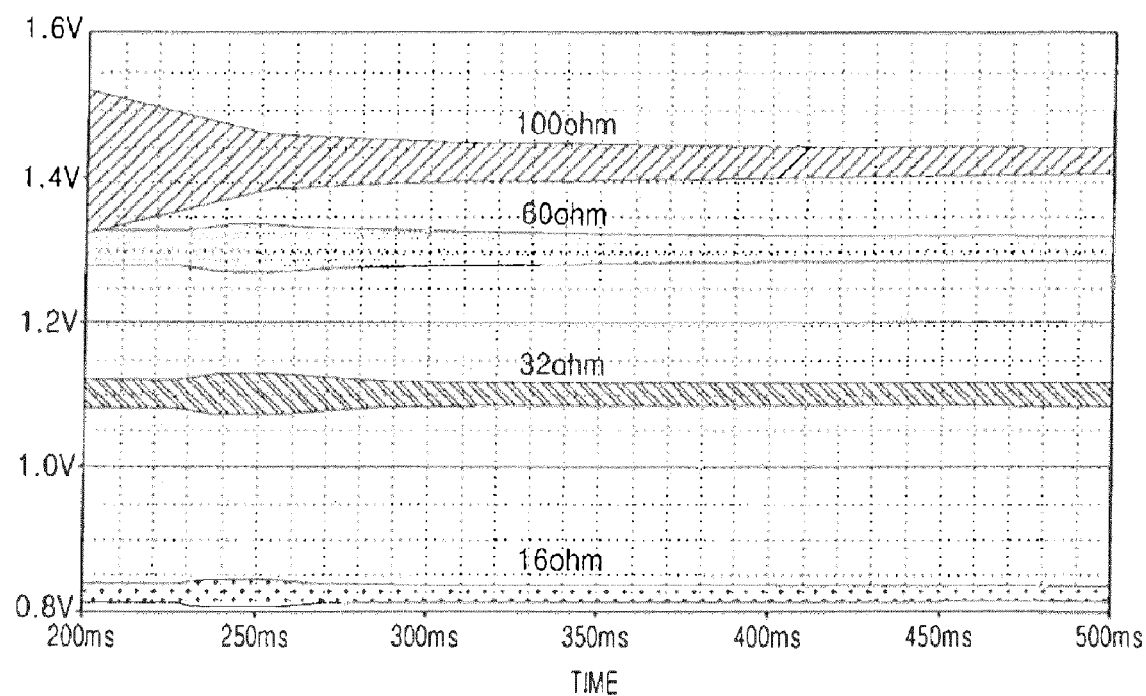
FIG. 5 illustrates a result of a simulation of the headphone impedance measuring circuit of FIG. 4.

FIG. 5 illustrates a result of a simulation of the headphone impedance measuring circuit of FIG. 4. FIG. 5 shows voltage values measured at voltage detection point 440 for impedances 430 of 16Ω, 32Ω, 60Ω, and 100Ω.

Referring to FIG. 5, the voltage value at the voltage detection point 440 varies with respect to the impedance 430 of the headphone. Accordingly, the micom unit 310 can identify the impedance 430 of the headphone through a preset table or the like, from the voltage value detected differently with respect to the impedance 430 of the headphone. For example, if the voltage value is in a range of 0.04~0.05V, it can be determined that the impedance of the headphone 350 is 32Ω. If the voltage value is in a range of 0.02~0.03V, it can be determined that the impedance is 16Ω.

Figure 6:
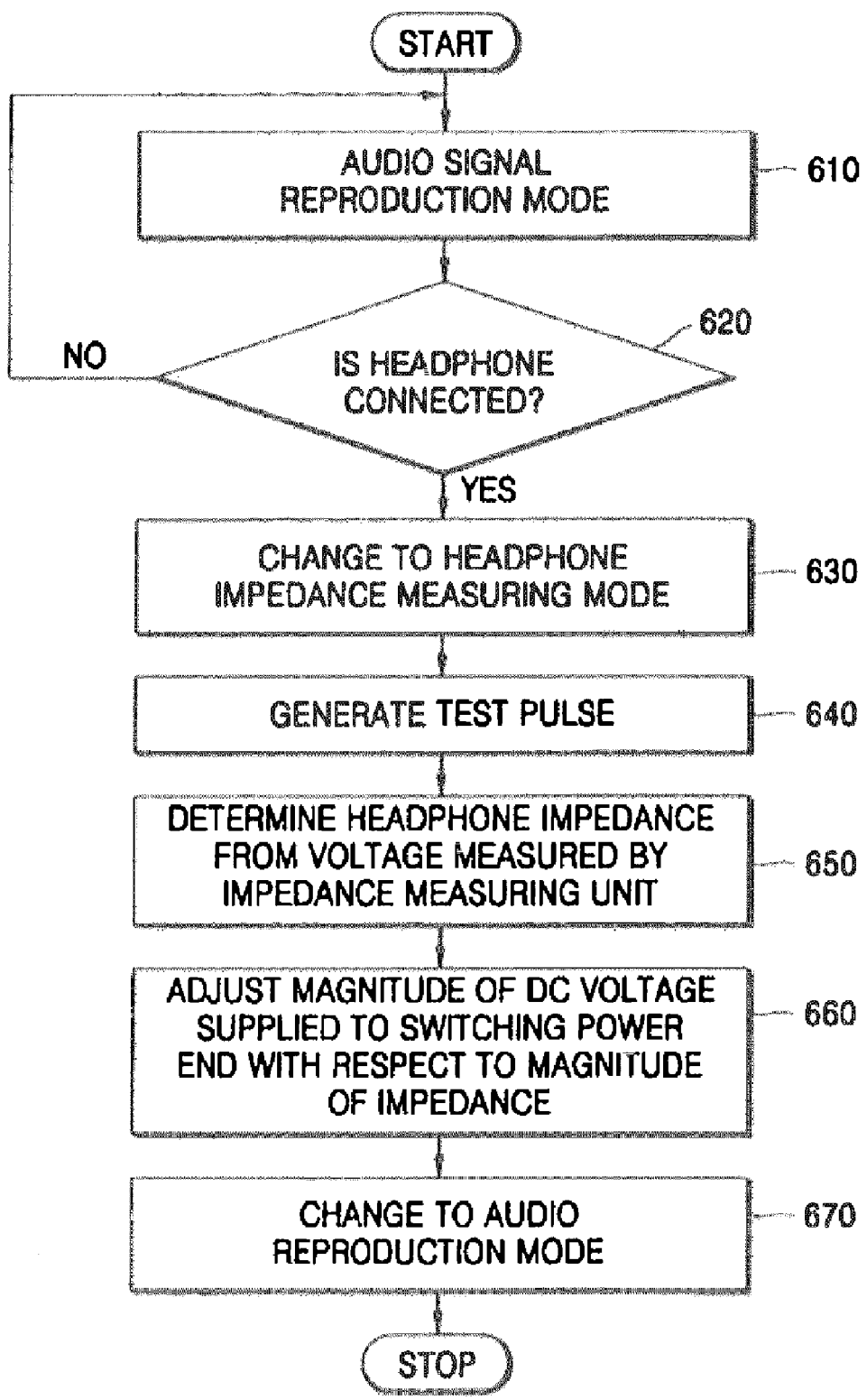
FIG. 6 is a flowchart illustrating a control method of a micom unit of the output power controlling apparatus of FIG. 3, according to an embodiment of the present general inventive concept.

FIG. 6 is a flowchart illustrating a control method of the micom unit 310 of the output power controlling apparatus of FIG. 3, according to an embodiment of the present general inventive concept.

First, if a power is turned on, the output power controlling apparatus is initialized to the audio reproducing mode in operation 610.

Then, it is determined (i.e., sensed) whether a headphone (e.g., 350 in FIG. 3) or earphone is connected to the output power controlling apparatus in operation 620. A method of sensing a connection of the headphone 350 (i.e., whether a headphone or earphone is connected to the output power controlling apparatus) may be performed by using a known technology, for example, by using changes in a voltage level of an output end of the headphone 350.

If the connection of the headphone 350 to the output power controlling apparatus is sensed, the audio reproducing mode is switched to the headphone impedance measuring mode in operation 630.

A test pulse signal with a predetermined duty cycle is then generated in the headphone impedance measuring mode in operation 640.

Then, the headphone impedance is determined using a preset table based on a voltage value measured between the headphone 350 and a test resistor (e.g., $R_T$) to which a DC current is applied in operation 650.

Then, with respect to a magnitude of the impedance of the headphone 350, the magnitude of the DC voltage supplied to a switching power end is adjusted in operation 660. The headphone impedance measuring mode is switched to the audio reproducing mode in operation 670.

Figure 7:
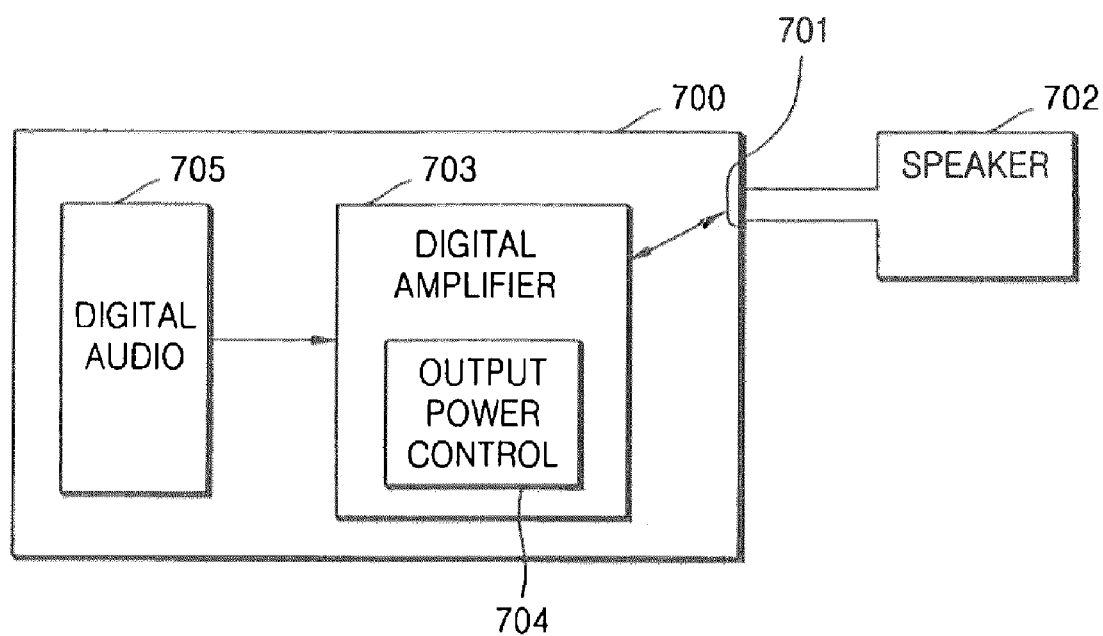
FIG. 7 illustrates a portable audio player according to an embodiment of the present general inventive concept.

FIG. 7 illustrates a portable audio player (device) 700 according to an embodiment of the present general inventive concept. The portable audio player 700 includes a digital audio unit 705, a digital amplifier 703, an output port 701, and at least one speaker unit 702. The digital amplifier 703 includes an output power control apparatus 704. The output power control apparatus 704 may be similar to the output power control apparatus of FIG. 3 (described above). The digital audio unit 705 provides digital audio to the digital amplifier 703 such that the digital amplifier 703 amplifies the digital audio and outputs a signal to drive the at least one speaker unit 702. The at least one speaker unit 702 is connected to the portable audio player 700 via the output port 701. The output power control apparatus 704 operates between an impedance measuring mode (described above) and an audio reproduction mode (also described above) to vary a DC power supply applied to the at least one speaker unit 702 based on a measured impedance of the at least one speaker unit 702. Accordingly, an optimum sound level can be produced by the portable audio player 700 using a variety of different speaker units having a variety of different impedances. The at least one speaker unit 702 may be a speaker, a headphone, an earphone, etc.

The present general inventive concept can be embodied as computer readable codes on a computer readable recording medium. The computer readable recording medium is any data storage device that can store data which can be thereafter read by a computer system. Examples of the computer readable recording medium include read-only memory (ROM), random-access memory (RAM), CD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion.

According to embodiments of the present general inventive concept as described above, an impedance of an earphone or headphone connected to an audio device using a digital amplifier is automatically determined and an appropriate output level can be determined with respect to the impedance.

Accordingly, the embodiments of the present general inventive concept utilizes characteristics of a portable audio device and a digital amplifier such that an impedance of an earphone or headphone can be effectively and accurately measured and a resultant optimum sound level can be output without adding a separate unit or increasing material costs.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An apparatus to control an output power of a digital amplifier in a digital audio amplification device, the apparatus comprising:
   a signal processing unit to power amplify a pulse signal and to convert the pulse signal into a direct current (DC) voltage in an impedance measuring mode and to extract an audio signal from a PWM signal in an audio reproduction mode;
   an impedance measuring unit to connect a resistance device between the signal processing unit and a speaker unit and to detect a voltage value applied to the resistance device and the speaker unit; and
   a micom unit to generate a test pulse generation control signal which is modulated into a pulse signal having a predetermined duty cycle in the signal processing unit if the speaker unit is connected to the device, to determine an impedance of the speaker unit based on the voltage value detected by the impedance measuring unit, to control a power amplification of the PWM signal by providing a voltage level control signal to control a switching power level of the signal processing unit according to the determined impedance, and to control an audio level in an audio reproduction mode accordingly.

2. The apparatus of claim 1, wherein the signal processing unit comprises:
   a pulse width modulation (PWM) unit to generate the PWM signal by comparing an audio signal and a carrier signal in the audio reproducing mode, and to generate the pulse signal with the predetermined duty cycle in the impedance measuring mode;
a power supply unit to vary an output voltage according to the voltage level control signal of the micom unit;
a switching unit to power amplify the PWM Signal or the pulse signal with the predetermined duty cycle by switching with respect to the voltage supplied by the power supply unit; and
a low-pass filter unit to remove a high frequency component of the signal output from the switching unit.

3. The apparatus of claim 2, wherein the impedance measuring unit comprises:
a voltage measuring unit to pass an audio signal by connecting the low-pass filter unit and the speaker unit when the apparatus operates in the audio reproducing mode, and to connect the resistance device between the low-pass filter unit and the speaker unit and detect the voltage value between the resistance device and the speaker unit when operating in the impedance measuring mode; and
an ADC unit to convert the voltage value measured by the voltage measuring unit into data.

4. The apparatus of claim 3, wherein the voltage measuring unit comprises a switching unit to pass the signal output from the low-pass filter to the speaker unit when the apparatus operates in the audio reproducing mode, and to pass the signal output from the low-pass filter to the speaker unit through the resistance device when the apparatus operates in the impedance measuring mode.

5. The apparatus of claim 1, further comprising:
a digital signal processor to receive a volume level control signal corresponding to the impedance of the speaker unit determined by the micom unit, and to adjust a level of the audio volume accordingly.

6. The apparatus of claim 1, wherein the speaker unit is either one of a headphone and an earphone.

7. A digital amplifier usable in a portable audio device, the amplifier comprising:
a signal processing unit having a variable power supply unit to output a variety of voltages, the signal processing unit receiving an audio signal and amplifying the audio signal based on a DC voltage currently output by the variable power supply unit;
an impedance measuring unit having a resistive element with a first end connected to the signal processing unit and a second end connected to an output of the portable device and to measure an impedance value of any speaker unit connected to the output of the portable audio device and to output an impedance detection signal; and
a micom unit to receive the impedance detection signal and to control the variable power supply unit to update the DC voltage currently output based on the measured impedance value indicated by the impedance detection signal.

8. A portable audio device, comprising:
a signal processing unit which includes a digital amplifier, wherein the digital amplifier amplifies a test pulse generation control signal or an audio signal based on a power supply level of a power supply; and
a power supply control unit to vary the power supply level of the power supply based on an impedance of at least one speaker unit connected to the digital amplifier,
wherein the signal processing unit power amplifies a pulse signal with a predetermined duty cycle and converts the pulse signal into a direct current (DC) voltage in an impedance measuring mode, and
wherein the signal processing unit power amplifies a pulse signal with a duty cycle corresponding to an instantaneous amplitude of an audio signal in an audio reproduction mode.

9. The portable audio device of claim 8, wherein the digital amplifier switches between the impedance measuring mode in which the power supply control unit detects the impedance of the at least one speaker unit and sets the power supply level accordingly, and the audio reproduction mode in which the digital amplifier outputs the amplified audio signal to the at least one speaker unit.

10. The portable audio device of claim 8, wherein the digital amplifier and the power supply control unit operate in the impedance measuring mode when the portable audio device is initially turned on or when the at least one speaker unit is initially connected to the portable audio device, and the digital amplifier and the power supply control unit switch to the audio reproduction mode once the impedance of the at least one speaker unit is determined.

11. The portable audio device of claim 8, wherein the power supply control, unit comprises:
an impedance measuring unit to connect a resistance device between the signal processing unit and the at least one speaker unit and to detect a voltage value applied to the resistance device and the speaker unit; and
a micom unit to generate a test pulse generation control signal which is modulated into a pulse signal having a predetermined duty cycle in the signal processing unit if the at least one speaker unit is connected to the portable audio device, to determine the impedance of the at least one speaker unit based on the voltage value detected by the impedance measuring unit in the impedance measuring mode, and
to control a power amplification by providing a voltage level control signal to the signal processing unit according to the determined impedance, and to control an audio level in the audio reproduction mode accordingly.

12. A portable audio device, comprising:
a digital amplifier to amplify an audio signal based on a power supply level of a power supply; and
an apparatus to control an output power of the digital amplifier by varying the power supply level of the power supply based on an impedance of at least one speaker unit connected to the digital amplifier, the apparatus including
a signal processing unit to power amplify a pulse signal and to convert the pulse signal into a direct current (DC) voltage,
an impedance measuring unit to connect a resistance device between the signal processing unit and the at least one speaker unit and to detect a voltage value applied to the resistance device and the at least one speaker unit, and
a micom unit to generate a test pulse generation control signal which is modulated into a pulse signal having a predetermined duty cycle in the signal processing unit if the at least one speaker unit is connected to the portable audio device, to determine the impedance of the at least one speaker unit based on the voltage value detected by the impedance measuring unit, to control a power amplification by providing a voltage level control signal to the signal processing unit according to the determined impedance, and to control an audio level in an audio reproduction mode accordingly.

13. A portable audio device, comprising:
a signal processing unit having a first terminal to generate a voltage signal in a headphone impedance measuring mode;
a second terminal to be connected to an external headphone;
an impedance measuring unit to selectively connect the first terminal to a first end of a resistive device and the second terminal to a second end of the resistive device to generate one of a first value and a second value according to the voltage signal corresponding to a characteristic of the external headphone; and
a processor unit to control the signal processing unit to generate one of a first audio reproducing signal and a second audio reproducing signal according to the one of the first value and the second value.

14. A method of controlling output power of a digital audio amplification device, the method comprising:
if a speaker unit is connected to the digital audio amplification device, setting an impedance measuring mode and generating an arbitrary pulse signal;
converting the arbitrary pulse signal into a DC voltage;
applying the DC voltage to a resistance device connected to the speaker unit and detecting a voltage between the resistance device and the speaker unit;
determining an impedance of the speaker unit based on the detected voltage; and
adjusting a level of audio being reproduced by providing a voltage level control signal to control a switching power level according to the determined impedance of the speaker unit.

15. The method of claim 14, wherein the arbitrary signal is a pulse signal with a predetermined duty cycle.

16. The method of claim 14, wherein the determining of the impedance of the speaker unit comprises determining the impedance of the speaker unit corresponding to the voltage value with reference to a preset table.

17. The method of claim 14, further comprising:
adjusting a level of audio volume corresponding to the impedance of the speaker unit.

* * * * *